(12) United States Patent
Chen (10) Patent No.: US 12,471,264 B2
(45) Date of Patent: Nov. 11, 2025

(54) SEMICONDUCTOR DEVICE AND METHOD OF FORMING THE SAME

(71) Applicant: Taiwan Semiconductor Manufacturing Company, Ltd., Hsinchu (TW)

(72) Inventor: Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 572 days.

(21) Appl. No.: 17/887,533

(22) Filed: Aug. 15, 2022

(65) Prior Publication Data
US 2024/0057307 A1     Feb. 15, 2024

(51) Int. Cl.
*H10B 10/00*   (2023.01)
*G11C 5/06*    (2006.01)
*H01L 23/522*  (2006.01)
*H01L 23/528*  (2006.01)

(52) U.S. Cl.
CPC .............. *H10B 10/12* (2023.02); *G11C 5/06* (2013.01); *H01L 23/5226* (2013.01); *H01L 23/5283* (2013.01)

(58) Field of Classification Search
CPC ....... H10B 10/12; G11C 5/06; H01L 23/5226; H01L 23/5283
USPC .......................................................... 257/288
See application file for complete search history.

(56) References Cited

U.S. PATENT DOCUMENTS

2019/0273108 A1* 9/2019 Sato ...................... H10F 39/809
2021/0327838 A1* 10/2021 Hou ........................ H01L 24/03
2021/0407942 A1* 12/2021 Yu ....................... H01L 25/0652

* cited by examiner

*Primary Examiner* — Tu-Tu V Ho
(74) *Attorney, Agent, or Firm* — JCIPRNET (57) ABSTRACT

A semiconductor device includes a first functional block and a second functional block. The first functional block includes a first substrate, a first device layer, a first interconnect structure and a plurality of first bonding patterns, and the first interconnect structure includes a plurality of first conductive patterns. The first bonding patterns are irregularly arranged. The second functional block is bonded to the first functional block. The second functional block includes a second substrate, a second device layer, a second interconnect structure and a plurality of second bonding patterns, and the second bonding patterns are in direct contact with the first bonding patterns.

20 Claims, 9 Drawing Sheets

SEMICONDUCTOR DEVICE AND METHOD OF FORMING THE SAME

BACKGROUND

Static Random Access Memory (SRAM) is chosen as a reliable, proven technology for high-performance stand-alone memory devices or embedded memory devices. The distinct advantages of an SRAM include fast access speed, low power consumption, high noise margin, and process compatibility with a conventional CMOS fabrication process, among others.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
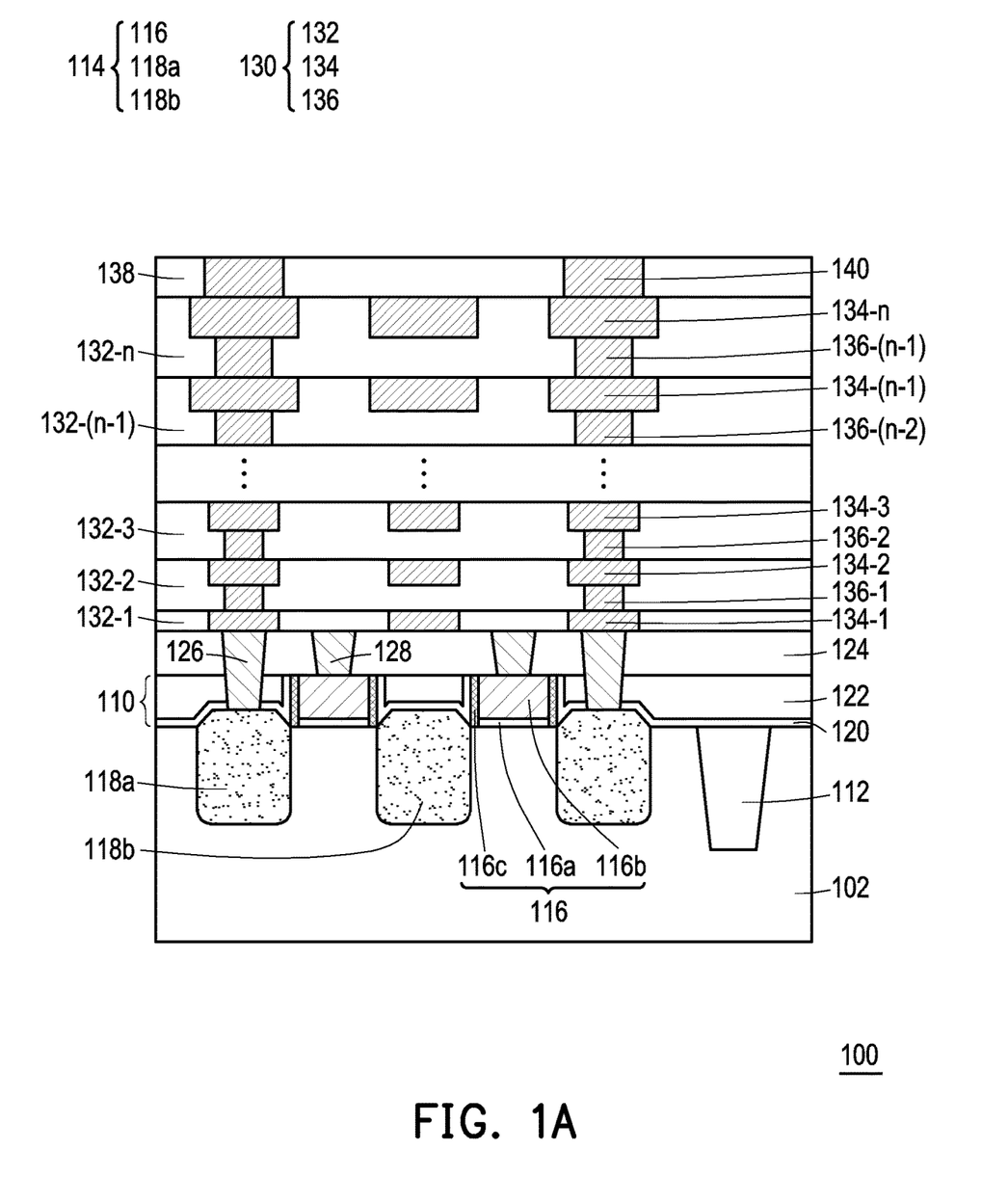
FIG. 1A to FIG. 1C are schematic cross-sectional views of various stages in a method of forming a semiconductor device according to some embodiments.
Figure 1B:
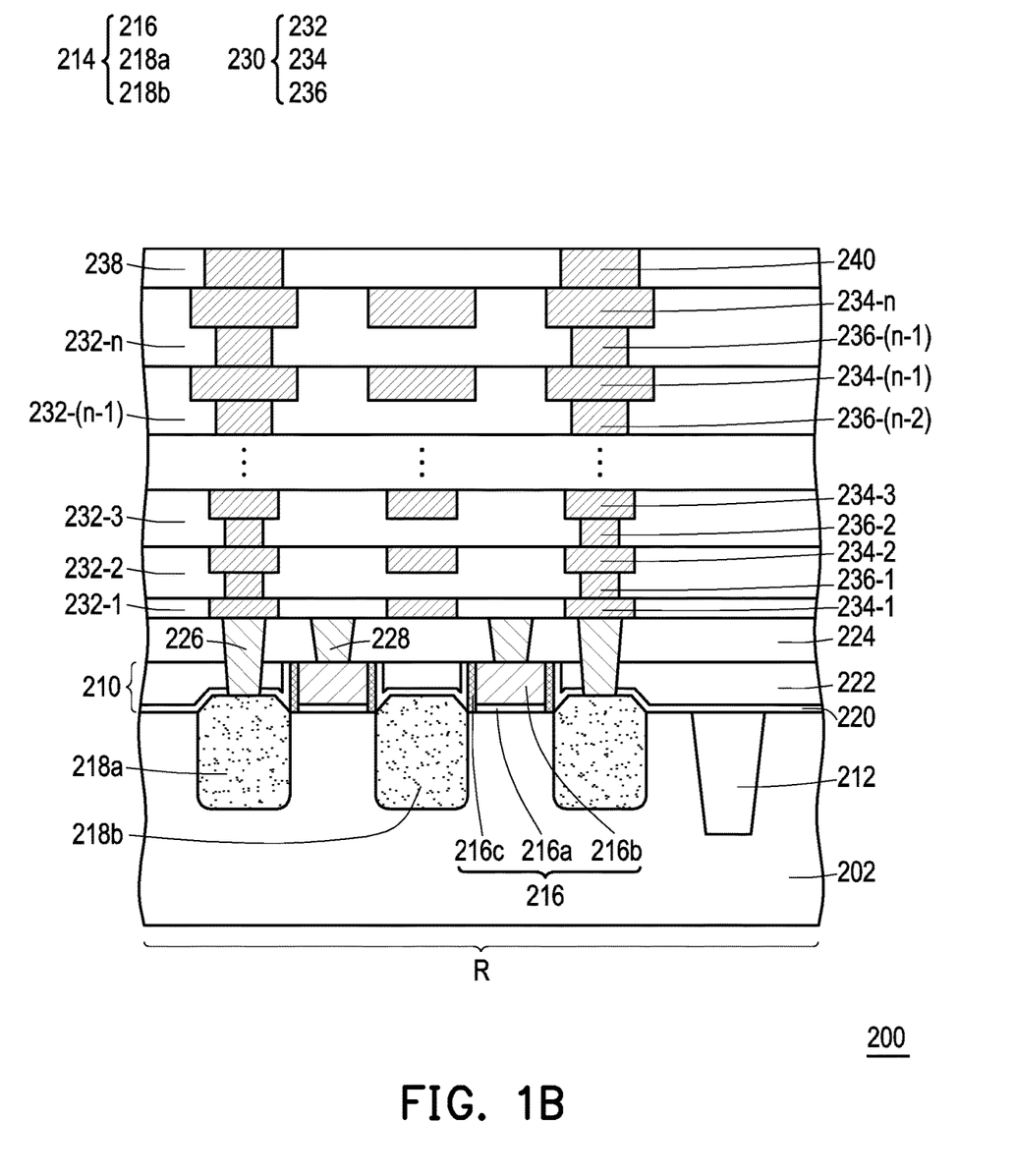
Figure 1C:
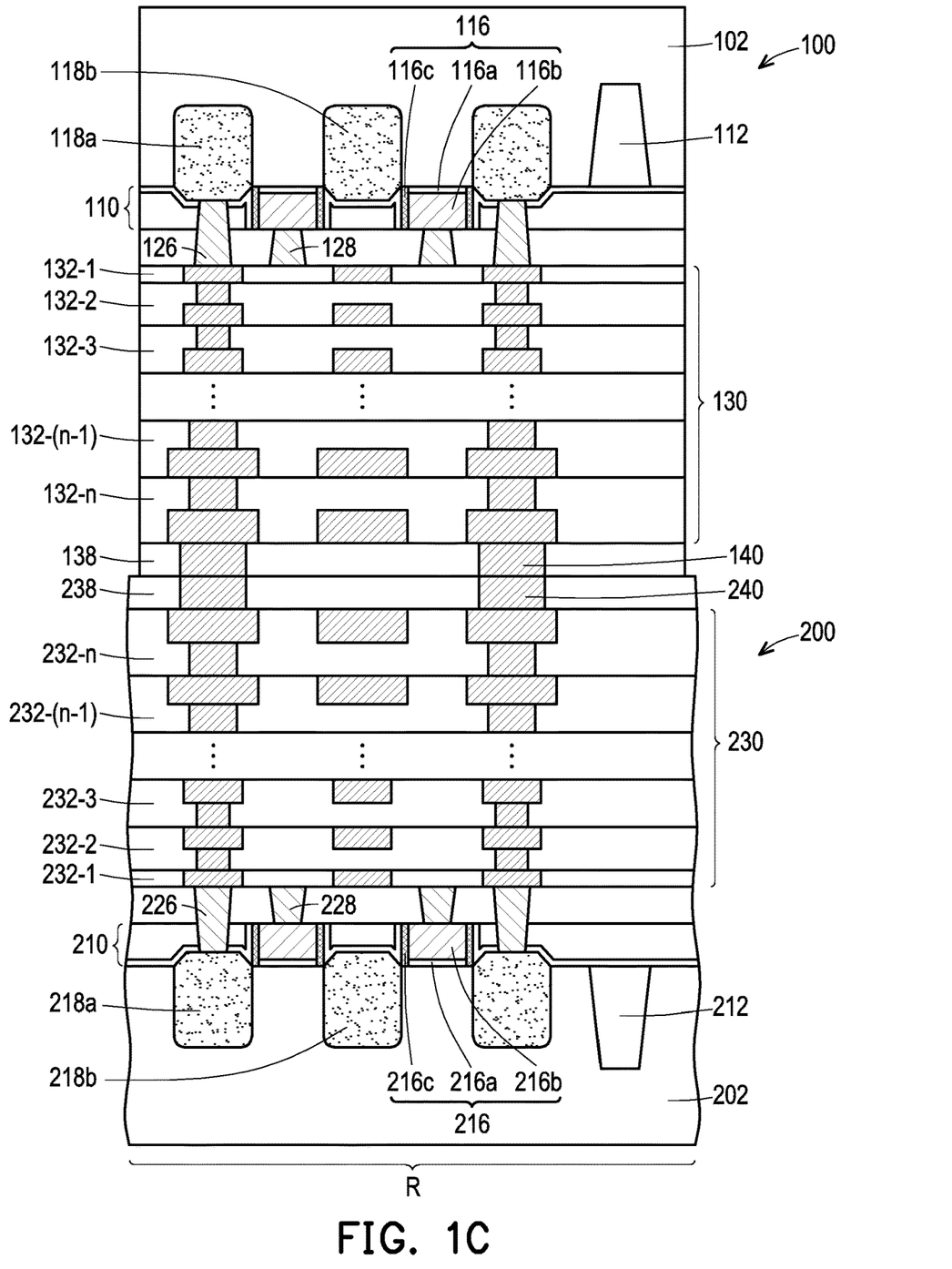

FIG. 1A to FIG. 1C are schematic cross-sectional views of various stages in a method of forming a semiconductor device according to some embodiments.

Referring to FIG. 1A, a semiconductor substrate 102 is provided. In some embodiments, the semiconductor substrate 102 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as silicon (Si), germanium (Ge), silicon germanium (SiGe), carbon doped silicon (Si:C), silicon germanium carbon (SiGeC); or an III-V compound semiconductor such as gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the semiconductor substrate 102, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the semiconductor substrate 102 is a semiconductor-on-insulator (SOI) substrate including a top semiconductor layer formed on an insulator layer (not shown). The top semiconductor layer includes the above-mentioned semiconductor material such as Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

Then, a device layer 110 is formed over the semiconductor substrate 102. For example, a plurality of active devices 114 are formed in and over the semiconductor substrate 102. In some embodiments, a plurality of isolation structures 112 are formed in the semiconductor substrate 102 to define an active area where the active device 114 are formed. The active device 114 may include a gate structure 116, a source region 118a and a drain region 118b at opposite sides of the gate structures 116. The gate structure 116 may include a gate dielectric layer 116a, a gate electrode 116b on the gate dielectric layer 116a and spacers 116c on opposite sidewalls of the gate dielectric layer 116a and the gate electrode 116b.

In some embodiments, the gate dielectric layer 116a includes an oxide, a metal oxide, the like, or combinations thereof. The gate electrode 116b may include a metal-containing material such as titanium nitride, titanium oxide, tantalum nitride, tantalum carbide, cobalt, ruthenium, aluminum, tungsten, combinations thereof, or multi-layers thereof. The source region 118a and the drain region 118b may be epitaxial source and drain regions epitaxially grown in a recess (not shown) of the semiconductor substrate 110 using a process such as chemical vapor deposition (CVD), atomic layer deposition (ALD), vapor phase epitaxy (VPE), molecular beam epitaxy (MBE), or the like. Top surfaces of the source region 118a and the drain region 118b may be protruded from or substantially flush with a surface of the semiconductor substrate 110, and bottom surfaces of the source region 118a and the drain region 118b may be substantially flush with each other. When the source region 118a and the drain region 118b are in an n-type region, e.g., the NMOS region, the source region 118a and the drain region 118b may include any acceptable material appropriate for n-type FETs. For example, the source region 118a and the drain region 118b include silicon, silicon carbide, phosphorous doped silicon carbide, silicon phosphide, or the like. When the source region 118a and the drain region 118b are in a p-type region, e.g., the PMOS region, the source region 118a and the drain region 118b may include any acceptable material appropriate for p-type FETs. For example, the source region 118a and the drain region 118b include silicon-germanium, boron doped silicon-germanium, germanium, germanium tin, or the like.

In alternative embodiments, the active device 114 is a nano-FET, and the active device 114 further includes nanostructures (not shown) under the gate structure 116. The nanostructures may form channel regions of nano-FETs. For example, some nanostructures are formed of a first semiconductor material suitable for p-type nano-FETs, such as silicon germanium or the like, and some nanostructures are formed of a second semiconductor material suitable for n-type nano-FETs, such as silicon, silicon carbon, or the like.

In some embodiments, a contact etch stop layer (CESL) 120 is formed over the semiconductor substrate 110, and dielectric layers 122, 124 are formed over the CESL 120. For example, the CESL 120 is disposed between the dielectric layer 122 and the source region 118a, between the dielectric layer 122 and the drain region 118b and between the dielectric layer 122 and the spacers 116c. The CESL 120 may include a dielectric material, such as, silicon nitride, silicon oxide, silicon oxynitride, or the like, having a different etch rate than the material of the overlying dielectric layer 122. The dielectric layer 122, 124 may include TEOS formed oxide, undoped silicate glass, or doped silicate glass such as BPSG, FSG, PSG, BSG, and/or other suitable dielectric materials. In some embodiments, the dielectric layer 122, 124 is deposited by CVD, PECVD, PVD, spin coating, the like, or a combination thereof. In some embodiments, a gate contact 128 and a source contact 126 are formed to electrically connect to the gate structure 116 and the source region 118a respectively. A material of the gate contact 128 and the source contact 126 may include aluminum, titanium, copper, nickel, tungsten, and/or alloys thereof. The gate contact 128 and the source contact 126 may be formed by electroplating, deposition, the like or a combination thereof. In an embodiment, the gate contact 128 and the source contact 126 may be formed by depositing a seed layer of copper or a copper alloy, and filling the openings by electroplating.

Then, an interconnect structure 130 is formed over the dielectric layer 124. The interconnect structure 130 may include a plurality of dielectric layers 132-1, ..., 132-(n–1), 132-n (collectively referred to as dielectric layers 132), a plurality of conductive wirings 134-1, ..., 134-(n–1), 134-n (collectively referred to as conductive wirings 134) and a plurality of conductive vias 136-1, ..., 136-(n–2), 136-(n–1) (collectively referred to as conductive vias 136) interconnecting the conductive wirings 134-1, ..., 134-(n–1), 134-n. In some embodiments, "n" indicates a minimum number for stacked layers of wirings, which are sufficient to perform main function of the functional block 100 with the device layer 110. For example, when n is 6, the interconnect structure 130 includes 6 layers of conductive wirings (i.e., conductive wirings 134-1, 134-2, 134-3, 134-4, 134-5, 134-6) and 5 layers of conductive vias (i.e., conductive vias 136-1, 136-2, 136-3, 136-4, 136-5), and the conductive wirings 134-1 to 134-6 and the conductive vias 136-1 to 136-5 together with the device layer 110 are sufficient to perform main function of the functional block 100. In other words, redundant (useless) wirings or vias which are not necessary for the main function of the functional block 100 are eliminated from the interconnect structure 130. In some embodiments, after forming the interconnect structure 130, the main function of the functional block 100 is achieved. The functional block 100 is also referred to as a minimum functional unit or a minimum functional block. The functional block 100 may serve as or be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The functional block 100 is then packaged in subsequent processing to form a semiconductor device such as a semiconductor package. In an embodiment in which the functional block 100 serves as or is a memory die (such as SRAM) and performs main function of the memory (e.g., equivalent to level 0 (L0) block such as micro operations cache), n is a positive integer not larger than 7. For example, n is 6 or 7. However, it should be appreciated that the interconnect structure 130 may include any number of stacked layers of wiring or vias.

In some embodiments, the dielectric layer 132-1, ..., 132-(n–1), 132-n include a dielectric material, such as a low-k dielectric material having a dielectric constant (k) less than 4, an extra low-k (ELK) dielectric material, or the like. The dielectric layers 132-1, ..., 132-(n–1), 132-n may be deposited using an appropriate process, such as, CVD, ALD, PVD, PECVD, or the like.

In some embodiments, the conductive wirings 134-1, ..., 134-(n–1), 134-n and the conductive vias 136-1, ..., 136-(n–2), 136-(n–1) are also referred to as conductive patterns, conductive features or functional conductive patterns. In some embodiments, the conductive wirings 134-1, ..., 134-(n–1), 134-n are also referred to as routings or conductive lines. In addition, the conductive patterns at the same level (i.e., bottom surfaces thereof all at a first height and top surfaces thereof all at a second height) may be also collectively referred to as a metallization layer. For example, the conductive wirings 134-1 belong to a first metallization layer, and the conductive wirings 134-n belong to an $n^{th}$ metallization layer. In some embodiments, the conductive wirings 134-1, . . . , 134-(n−1), 134-n and the conductive vias 136-1, . . . , 136-(n−2), 136-(n−1) are formed using a single damascene process or a dual-damascene process. For example, a respective dielectric layer 132-1, . . . , 132-(n−1), 132-n is patterned utilizing a combination of photolithography and etching techniques to form trenches corresponding to the desired pattern of the conductive wirings 134-1, . . . , 134-(n−1), 134-n and the conductive vias 136-1, . . . , 136-(n−2), 136-(n−1). An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the conductive wirings 134-1, . . . , 134-(n−1), 134-n and the conductive vias 136-1, . . . , 136-(n−2), 136-(n−1) are formed by depositing a seed layer of copper or a copper alloy, and filling the trenches by electroplating. A chemical mechanical planarization (CMP) process or the like may be used to remove excess conductive material from a surface of the respective dielectric layer 132-1, . . . , 132-(n−1), 132-n and to planarize surfaces of the dielectric layer 132-1, . . . , 132-(n−1), 132-n and the conductive wirings 134-1, . . . , 134-(n−1), 134-n for subsequent processing. In alternative embodiments, the conductive wirings 134-1, . . . , 134-(n−1), 134-n and the conductive vias 136-1, . . . , 136-(n−2), 136-(n−1) are respectively formed by a single damascene process. In some embodiments, a pitch of the conductive wirings 134-1, . . . , 134-(n−1), 134-n increases as the conductive wirings 134-1, . . . , 134-(n−1), 134-n become far away from the device layer 110. Similarly, a pitch of the conductive vias 136-1, . . . , 136-(n−2), 136-(n−1) increases as the conductive vias 136-1, . . . , 136-(n−2), 136-(n−1) become far away from the device layer 110.

Figure 2A:
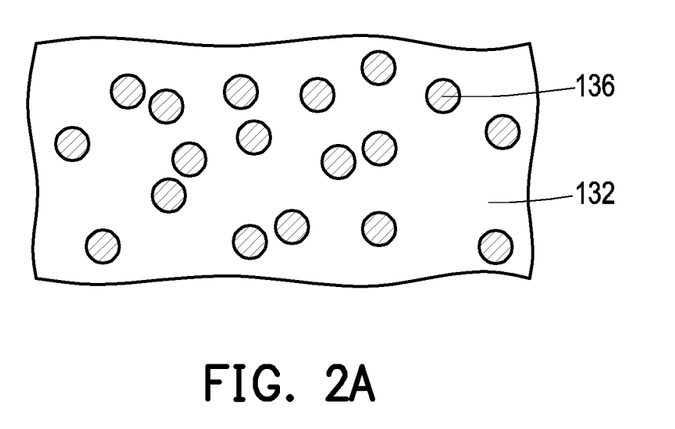
FIG. 2A is a top view of the outermost conductive patterns of the interconnect structure according to some embodiments.

In some embodiments, the conductive wirings 134-1, . . . , 134-(n−1), 134-n and the conductive vias 136-1, . . . , 136-(n−2), 136-(n−1) are vertically stacked. For example, the conductive wirings 134-1, . . . , 134-(n−1), 134-n and the conductive vias 136-1, . . . , 136-(n−2), 136-(n−1) are alternately stacked and in direct contact with one another. Since the conductive patterns (i.e., the conductive wirings 134-1, . . . , 134-(n−1), 134-n and the conductive vias 136-1, . . . , 136-(n−2), 136-(n−1)) in the interconnect structure 130 are not re-distributed, the arrangement of conductive patterns in each metallization layer is substantially the same or similar. In other words, the interconnect structure 130 is not a redistribution layer (RDL) structure. For example, from a top view, the conductive patterns (such as the conductive vias 136-1, . . . , 136-(n−2), or 136-(n−1)) in the same dielectric layer (such as the dielectric layer 132-1, . . . , 132-(n−1), or 132-n) are irregularly arranged, as shown in FIG. 2A. The conductive patterns (such as the conductive vias 136-1, . . . , 136-(n−2), or 136-(n−1)) are arranged without being re-distributed, and the distance therebetween is not uniform, for example. A pitch of the conductive patterns (such as the conductive vias 136-1, . . . , 136-(n−2), or 136-(n−1)) may be not larger than 3 μm such as not larger than 1 μm. In some embodiments, the conductive vias 136-1, . . . , 136-(n−2), and 136-(n−1) vertically stacked on one another are aligned with one another. For example, middle lines of the conductive vias 136-1, . . . , 136-(n−2), and 136-(n−1) vertically stacked on one another are aligned. Projections of the conductive vias 136-1, . . . , 136-(n−2), 136-(n−1) onto the semiconductor substrate 102 are overlapped. Similarly, the conductive wirings 134-1, . . . , 134-(n−1), 134-n vertically stacked on one another may be aligned with one another. For example, middle lines of the conductive wirings 134-1, . . . , 134-(n−1), 134-n vertically stacked on one another are aligned. Projections of the conductive wirings 134-1, . . . , 134-(n−1), 134-n onto the semiconductor substrate 102 are overlapped. In some embodiments, projections of the conductive wirings 134-1, . . . , 134-(n−1), 134-n and the conductive vias 136-1, . . . , 136-(n−2), 136-(n−1) onto the semiconductor substrate 102 are overlapped.

After forming the interconnect structure 130, a plurality of bonding patterns 140 are directly formed on the outermost conductive patterns of the interconnect structure 130. For example, a bonding dielectric layer 138 is directly formed on the dielectric layer 132-n, and the bonding patterns 140 are directly formed on the conductive wirings 134-n of the interconnect structure 130 respectively. In some embodiments, the material of the bonding dielectric layer 138 is different from the material of the dielectric layer 132-1, . . . , 132-(n−1), 132-n of the interconnect structure 130. In some embodiments, the bonding dielectric layer 138 includes silicon oxide, silicon nitride, a polymer or a combination thereof. The material of the bonding dielectric layer 138 is suitable for bonding such as being rich in hydrogen groups or hydroxyl groups. In alternative embodiments, the material of the bonding dielectric layer 138 is substantially the same as the material of the dielectric layer 132-1, . . . , 132-(n−1), 132-n of the interconnect structure 130. Similarly, a material of the bonding patterns 140 may be substantially the same as or different from a material of the conductive patters of the interconnect structure 130. The bonding patterns 140 may include tungsten (W), copper (Cu), a copper alloy, aluminum (Al), an aluminum alloy or a combination thereof. In some embodiments, a barrier layer may be disposed between the bonding patterns 140 and the bonding dielectric layer 138. The barrier layer includes Ta, TaN, Ti, TiN, CoW or a combination thereof, for example. In some embodiments, the bonding pattern 140 is formed by a single damascene process.

Figure 2B:
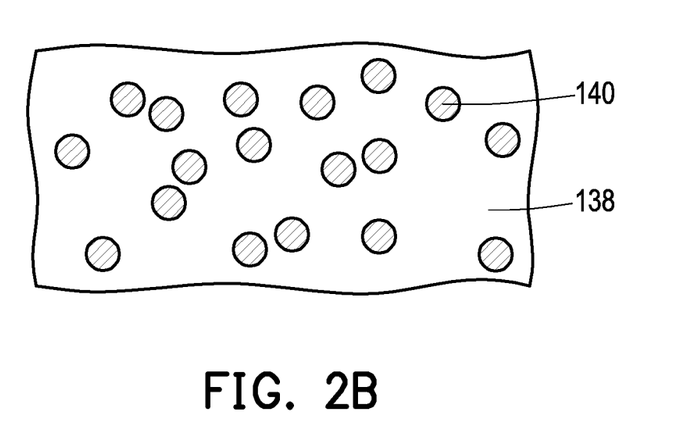
FIG. 2B is a top view of the bonding patterns according to some embodiments.

The bonding patterns 140 are bonding pads, bonding vias or combinations thereof. In some embodiments, the bonding patterns 140 are bonding vias. A pitch of the bonding patterns 140 may be not larger than 3 μm such as not larger than 1 μm. The pitch of the bonding patterns 140 may be substantially the same as or different from the pitch of the conductive vias 136. For example, the pitch of the bonding patterns 140 is larger than the pitch of the conductive vias 136 (e.g., the outermost conductive vias 136-(n−1)). However, the disclosure is not limited thereto. The pitch of the bonding patterns 140 may be substantially the same as or smaller than the pitch of the conductive vias 136. In some embodiments, as shown in FIG. 1A and FIG. 2B, the bonding patterns 140 are irregularly arranged without being re-distributed. The arrangement of the bonding patterns 140 is similar to or substantially the same as the arrangement of the conductive vias 136 of the interconnect structure 130 as shown in FIG. 2A. In alternative embodiments, the bonding patterns 140 are also referred to as conductive vias 136-n of the interconnect structure 130 since the bonding patterns 140 have substantially the same or similar arrangement as conductive vias 136. In other words, the bonding patterns 140 and the bonding layer 138 may be formed simultaneously with the interconnect structure 130.

In some embodiments, as mentioned before, the interconnect structure 130 has a minimum number of metallization layers for function, that is, redundant elements such as metallization layers and redistribution layer structure which are not necessary for main function are omitted. For example, compared to the SRAM die having L0 to L4, the functional block 100 has a simplified and compact structure. Accordingly, the performance such as operation rate may be improved and the required power may be reduced.

Referring to FIG. 1B, a functional block 200 is provided. The functional block 200 has a plurality of regions (such as a region R). In some embodiments, each region R is to be bonded to a functional block or a functional region of a functional block. The functional block 200 has a similar structure as the functional block 100. For example, the functional block 200 has a semiconductor substrate 202, a device layer 220, an interconnect structure 230 and a plurality of bonding patterns 240 in a bonding dielectric layer 238. The semiconductor substrate 202, the device layer 210, the interconnect structure 230 and the bonding patterns 240 may be formed using similar materials and methods as the semiconductor substrate 102, the device layer 110, the interconnect structure 130 and the bonding patterns 140 described above with reference to FIG. 1A, and the description is not repeated herein. For example, the semiconductor substrate 202 has isolation structures 212 therein. The device layer 210 includes a plurality of active devices 214. The active device 214 may include a gate structure 216, a source region 218a and a drain region 218b at opposite sides of the gate structures 216, and the gate structure 216 includes a gate dielectric layer 216a, a gate electrode 216b on the gate dielectric layer 216a and spacers 216c. Furthermore, the functional block 200 has a CESL 220 and dielectric layers 222, 224 thereon, and gate contact 228 and source contact 226 in the CESL 220 and the dielectric layers 222, 224.

The interconnect structure 230 may include a plurality of dielectric layers 232-1, . . . , 232-(n−1), 232-n (collectively referred to as dielectric layers 232), a plurality of conductive wirings 234-1, . . . , 234-(n−1), 234-n (collectively referred to as conductive wirings 234) and a plurality of conductive vias 236-1, . . . , 236-(n−2), 236-(n−1) (collectively referred to as conductive vias 236) interconnecting the conductive wirings 234-1, . . . , 234-(n−1), 234-n. In some embodiments, "n" indicates a minimum number for stacked layers of wirings, which are sufficient to perform main function of the functional block 200 with the device layer 210. In other words, redundant (useless) wirings or vias which are not necessary for the main function of the functional block 200 are eliminated from the interconnect structure 230. In some embodiments, after forming the interconnect structure 230, the main function of the functional block 200 is achieved. The functional block 200 is also referred to as a minimum functional unit or a minimum functional block. The functional block 200 may serve as or be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In an embodiment in which the functional block 200 serves as or is a CPU die or a GPU die, n is a positive integer larger than 10. For example, n is 11 or 12. In some embodiments, the functional block 100 serves as or is a memory die such as a SRAM die, and the functional block 200 serves as or is a logic die such as a CPU die or a GPU die. However, the disclosure is not limited thereto.

Figure 3A:
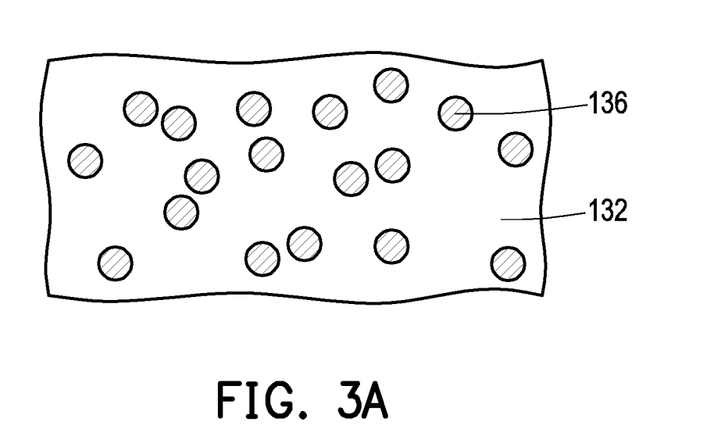
FIG. 3A is a top view of the outermost conductive patterns of the interconnect structure according to some embodiments.

In some embodiments, the conductive wirings 234-1, . . . , 234-(n−1), 234-n and the conductive vias 236-1, . . . , 236-(n−2), 236-(n−1) are vertically stacked. For example, the conductive wirings 234-1, . . . , 234-(n−1), 234-n and the conductive vias 236-1, . . . , 236-(n−2), 236-(n−1) are alternately stacked and in direct contact with one another. Since the conductive patterns (i.e., the conductive wirings 234-1, . . . , 234-(n−1), 234-n and the conductive vias 236-1, . . . , 236-(n−2), 236-(n−1)) in the interconnect structure 230 are not re-distributed, the arrangement of each metallization layer is substantially the same or similar. In other words, the interconnect structure 230 is not a redistribution layer (RDL) structure. For example, from a top view, the conductive patterns (such as the conductive vias 236-1, . . . , 236-(n−2), or 236-(n−1)) in the same dielectric layer (such as the dielectric layer 232-1, . . . , 232-(n−1), or 232-n) are irregularly arranged, as shown in FIG. 3A. The conductive patterns (such as the conductive vias 236-1, . . . , 236-(n−2), or 236-(n−1)) are arranged without being re-distributed, and the distance therebetween is not uniform, for example. A pitch of the conductive patterns (such as the conductive vias 236-1, . . . , 236-(n−2), or 236-(n−1)) may be not larger than 3 μm such as not larger than 1 μm. In some embodiments, the conductive vias 236-1, . . . , 236-(n−2), and 236-(n−1) vertically stacked on one another are aligned with one another. For example, middle lines of the conductive vias 236-1, . . . , 236-(n−2), and 236-(n−1) vertically stacked on one another are aligned. Projections of the conductive vias 236-1, . . . , 236-(n−2), 236-(n−1) onto the semiconductor substrate 102 are overlapped. Similarly, the conductive wirings 234-1, . . . , 234-(n−1), 234-n vertically stacked on one another may be aligned with one another. For example, middle lines of the conductive wirings 234-1, . . . , 234-(n−1), 234-n vertically stacked on one another are aligned. Projections of the conductive wirings 234-1, . . . , 234-(n−1), 234-n onto the semiconductor substrate 202 are overlapped. In some embodiments, projections of the conductive wirings 234-1, . . . , 234-(n−1), 234-n and the conductive vias 236-1, . . . , 236-(n−2), 236-(n−1) onto the semiconductor substrate 102 are overlapped.

Figure 3B:
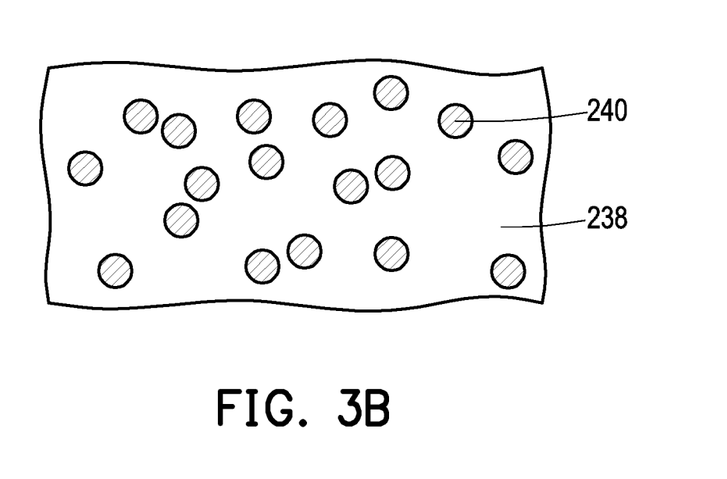
FIG. 3B is a top view of the bonding patterns according to some embodiments.

The bonding patterns 240 are directly formed on the outermost conductive patterns of the interconnect structure 230. For example, a bonding dielectric layer 238 is directly formed on the dielectric layer 232-n, and the bonding patterns 240 are directly formed on the conductive wirings 234-n of the interconnect structure 230 respectively. In some embodiments, as shown in FIG. 1A and FIG. 3B, the bonding patterns 240 are irregularly arranged without being re-distributed. The arrangement of the bonding patterns 240 is similar to or substantially the same as the arrangement of the conductive vias 236 of the interconnect structure 230 as shown in FIG. 3A. In alternative embodiments, the bonding patterns 240 are also referred to as conductive vias 236-n of the interconnect structure 230 since the bonding patterns 240 have substantially the same or similar arrangement as conductive vias 236. In other words, the bonding patterns 240 and the bonding layer 238 may be formed simultaneously with the interconnect structure 230.

In some embodiments, the bonding patterns 240 of the functional block 200 have an arrangement (e.g., the arrangement in FIG. 3B) similar to or substantially the same as an arrangement (e.g., the arrangement in FIG. 2B) of the bonding patterns 140 of the functional block 100, as long as they may be aligned to each other through an alignment process. A pitch of the bonding patterns 240 may be not larger than 3 µm such as not larger than 1 µm. A width of the bonding patterns 240 may be not larger than 100 nm. A size (e.g., contact area, pitch, height) of the bonding patterns 240 may be adjusted based on the bonding patterns 140 to be bonded. For example, the bonding patterns 240 of the functional block 200 have a different size (e.g., larger or smaller) from the bonding patterns 140 of the functional block 100 to be bonded, to increase the window of the bonding process. In some embodiments, the bonding patterns 240 of the functional block 200 have a larger size (e.g., contact area) than the bonding patterns 140 of the functional block 100. However, the disclosure is not limited. The bonding patterns 240 of the functional block 200 may have similar or substantially the same size as the bonding patterns 140 of the functional block 100 to be bonded. In some embodiments, as mentioned before, the interconnect structure 230 has a minimum number of metallization layers for function, that is, redundant elements such as metallization layers and redistribution layer structure which are not necessary for main function are omitted. Accordingly, the performance such as operation rate may be improved and the required power may be reduced.

Referring to FIG. 1C, the functional block 100 is bonded to the functional block 200. In some embodiments, the functional block 100 is bonded to the region R of the functional block 200. In some embodiments, the functional block 100 and the functional block 200 are face-to-face bonded together with the outermost conductive patterns. In some embodiments, before the functional block 100 and the functional block 200 are bonded, the bonding patterns 140 and the bonding patterns 240 are aligned, such that the bonding patterns 140 are bonded to the bonding patterns 240 and the bonding dielectric layer 138 is bonded to the bonding dielectric layer 238. In some embodiments, the alignment of the bonding patterns 140 and the bonding patterns 240 is achieved by using an optical sensing method. After the alignment is achieved, the functional block 100 and the functional block 200 are bonded together by a hybrid bonding including a metal-to-metal bonding and a dielectric-to-dielectric bonding. The functional block 100 and the functional block 200 may be bonded by via to via bonding, pad to pad bonding or via to pad bonding. After bonding, the semiconductor device is formed. The semiconductor device may have a system on integrated circuit (SoIC) structure. In some embodiments, the semiconductor device has block to block talk rather than die to die talk, and thus the performance of the semiconductor device may be improved. In addition, the function block 100 is bonded to the functional block 200 at a desired (necessary) location, and thus the semiconductor device may have a compact size.

Figure 4:
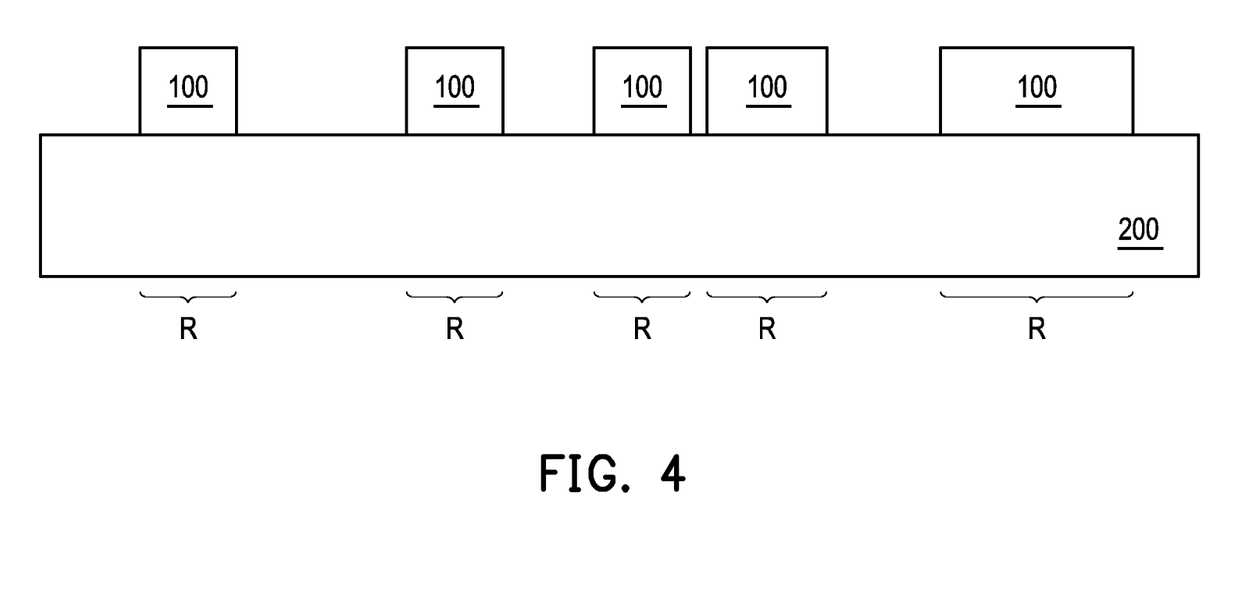
FIG. 4 is a schematic cross-sectional view of a semiconductor device according to some embodiments.
Figure 5A:
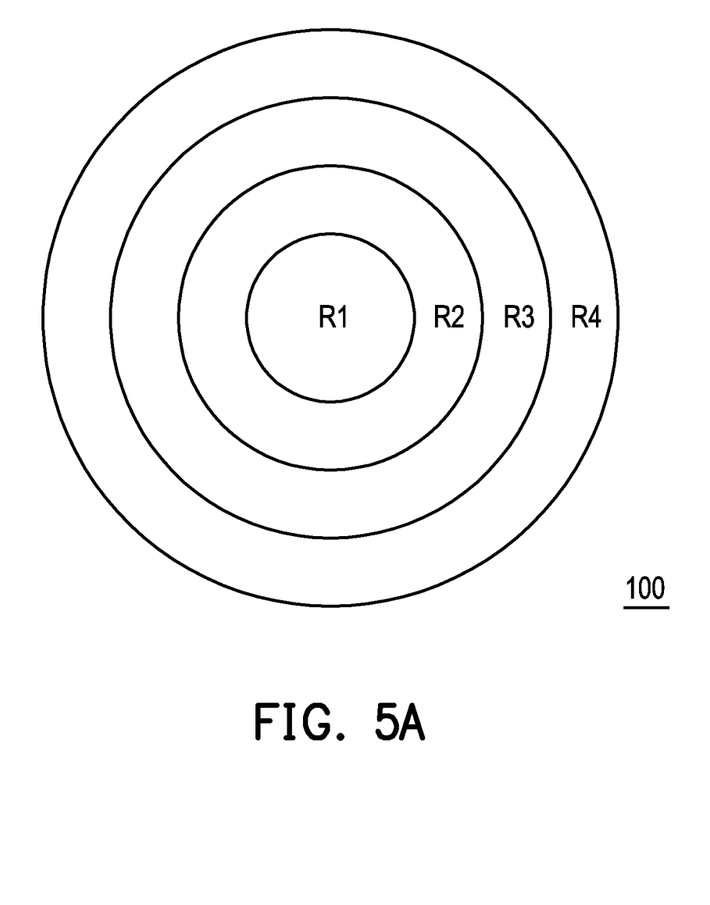
FIG. 5A and FIG. 5B are schematic top and cross-sectional views of a semiconductor device according to some embodiments.
Figure 5B:
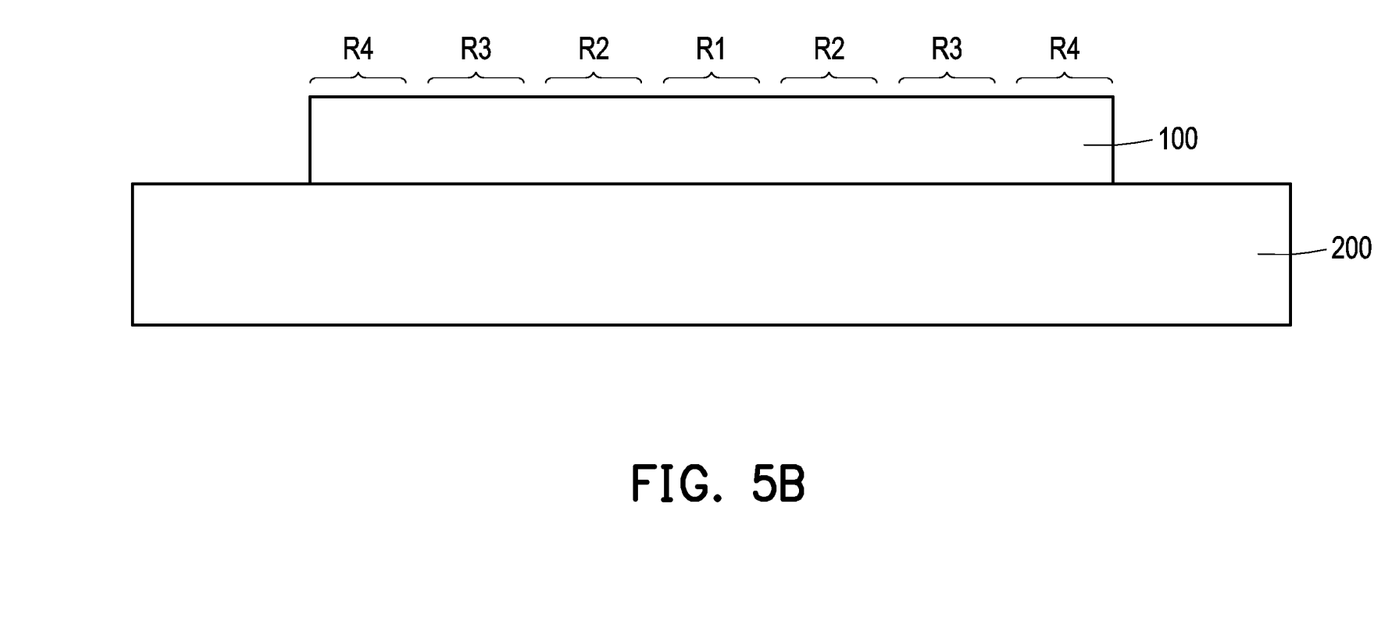

In some embodiments, one functional block 100 is illustrated. However, the disclosure is not limited thereto. In alternative embodiments, as shown in FIG. 4, a plurality of functional blocks 100 are respectively bonded to regions R of the functional block 200. The functional blocks 100 may perform different functions. For example, among the functional blocks 100, one performs functions equivalent to level 0 (L0) block of memory die such as SRAM, another performs functions equivalent to L0 plus L1 blocks of memory die such as SRAM, and the other performs functions equivalent to or L0 plus L1 plus L2 blocks of memory die such as SRAM. In such embodiments, the functional blocks 100 are merely disposed at desired locations of the functional block 200. In alternative embodiments, as shown in FIG. 5A and FIG. 5B, the functional block 100 has a plurality of functional regions R1-R4 radially disposed, and the functional regions R1-R4 of the functional block 100 are respectively bonded to the corresponding regions of the functional block 200. In some embodiments, the functional regions R1-R4 are defined by concentric circles, and from the functional region R1 to the functional region R4, levels in the memory hierarchy are increased. For example, the functional regions R1-R4 of the functional block 100 perform functions as L0 block, L1 block, L2 block, L3 block and L4 block of memory die, respectively. In such embodiments, the functional region R1-R4 of the functional block 100 has the structure similar to or substantially the same as FIG. 1A, and the bonding between the functional region R1-R4 of the functional block 100 and the corresponding regions of the functional block 200 is similar to or substantially the same as the bonding between the functional blocks 100 and 200 shown in FIG. 1C.

Figure 6:
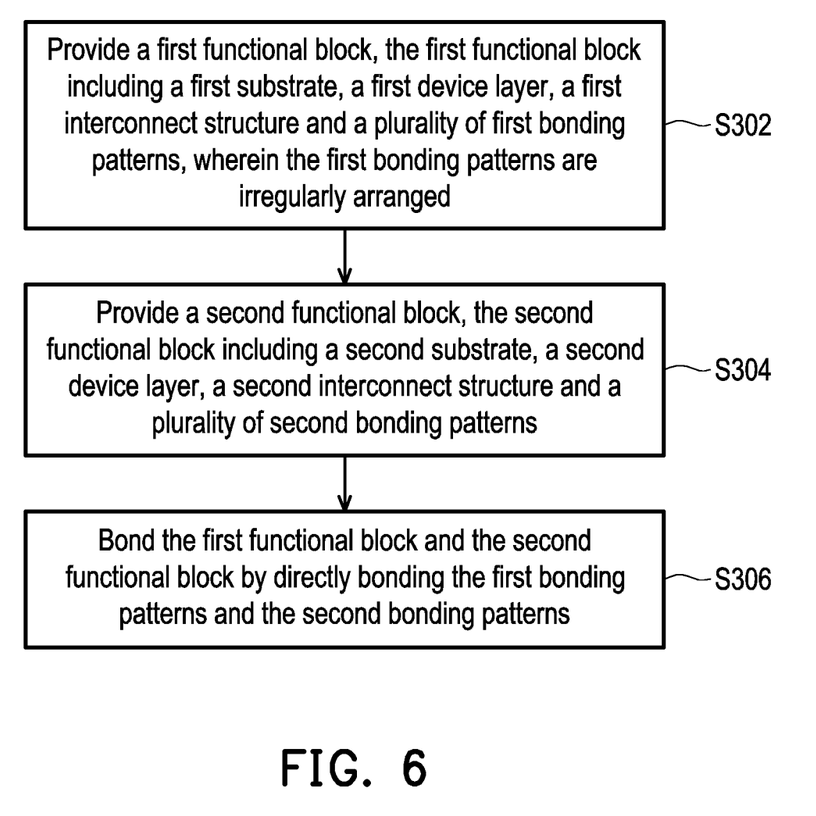
FIG. 6 illustrates a flowchart of a method of forming a semiconductor device in accordance with some embodiments.

FIG. 6 illustrates a flowchart of a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S302, a first functional block is provided, the first functional block includes a first substrate, a first device layer and a first interconnect structure, and the first interconnect structure includes a first bonding dielectric layer and a plurality of first bonding patterns. FIG. 1A, FIG. 3A, FIG. 4, FIG. 5A and FIG. 5B illustrate views corresponding to some embodiments of act S302.

At act S304, a second functional block is provided, and the second functional block includes a second substrate, a second device layer and a second interconnect structure, and the second interconnect structure includes a second bonding dielectric layer and a plurality of second bonding patterns, wherein the second bonding patterns are irregularly arranged. FIG. 1B, FIG. 3A, FIG. 4 and FIG. 5B illustrate views corresponding to some embodiments of act S304.

At act S306, the first functional block and the second functional block are bonded by directly bonding the first bonding patterns and the second bonding patterns. FIG. 1C, FIG. 3A, FIG. 4 and FIG. 5B illustrate views corresponding to some embodiments of act S306.

According to some embodiments, a semiconductor device is provided. The semiconductor device includes a first functional block and a second functional block. The first functional block includes a first substrate, a first device layer, a first interconnect structure and a plurality of first bonding patterns, and the first interconnect structure includes a plurality of first conductive patterns. The first bonding patterns are irregularly arranged. The second functional block is bonded to the first functional block. The second functional block includes a second substrate, a second device layer, a second interconnect structure and a plurality of second bonding patterns, and the second bonding patterns are in direct contact with the first bonding patterns.

According to some embodiments, a semiconductor device is provided. The semiconductor device includes a first functional block and a second functional block. The first functional block includes a first substrate, a first device layer, a plurality of first conductive patterns and a first bonding pattern. The first conductive patterns and the first bonding pattern are vertically stacked and in direct contact with one another, wherein the first bonding pattern are vertically overlapped with the first conductive patterns. The second functional block includes a second substrate, a second device layer, a plurality of second conductive patterns and a second bonding pattern. The second conductive patterns and the second bonding pattern are vertically stacked and in direct contact with one another, wherein the second bonding pattern is in direct contact with the first bonding pattern.

According to some embodiments, a method of forming a semiconductor device includes the following steps. A first functional block is provided. The first functional block includes a first substrate, a first device layer, a first interconnect structure and a plurality of first bonding patterns, wherein the first bonding patterns are irregularly arranged. A second functional block is provided. The second functional block includes a second substrate, a second device layer, a second interconnect structure and a plurality of second bonding patterns. The first functional block and the second functional block are bonded by directly bonding the first bonding patterns and the second bonding patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first functional block, comprising a first substrate, a first device layer, a first interconnect structure and a plurality of first bonding patterns, wherein the first interconnect structure comprises a plurality of first conductive vias and a plurality of first conductive wirings in direct contact with the first conductive vias and the first bonding patterns, the first conductive vias are irregularly arranged, and the first bonding patterns are irregularly arranged; and
   a second functional block bonded to the first functional block, comprising a second substrate, a second device layer, a second interconnect structure and a plurality of second bonding patterns, wherein the second bonding patterns are in direct contact with the first bonding patterns.

2. The semiconductor device of claim 1, wherein the first functional block further comprises a first bonding dielectric layer and the second functional block further comprises a second bonding dielectric layer in direct contact with the first bonding dielectric layer.

3. The semiconductor device of claim 1, wherein the second bonding patterns are irregularly arranged.

4. The semiconductor device of claim 1, wherein a pitch of the first bonding patterns and the second bonding patterns is not larger than 3 μm.

5. The semiconductor device of claim 1, wherein an arrangement of the first bonding patterns is substantially the same as an arrangement of the first conductive vias.

6. The semiconductor device of claim 1, wherein the second interconnect structure comprises a plurality of second conductive vias and a plurality of second conductive wirings in direct contact with the second conductive vias and the second bonding patterns, and the second conductive vias are irregularly arranged.

7. The semiconductor device of claim 1, wherein the first bonding patterns are irregularly arranged without being redistributed.

8. The semiconductor device of claim 1, wherein the first bonding patterns and the second bonding patterns are vias, pads or a combination thereof.

9. A semiconductor device, comprising:
   a first functional block, comprising a first substrate, a first device layer, a plurality of first conductive vias, a plurality of first conductive wirings and a plurality of first bonding patterns, the first conductive wirings being in direct contact with the first conductive vias and the first bonding patterns, wherein an arrangement of the first bonding patterns is substantially the same as an arrangement of the first conductive vias; and
   a second functional block, comprising a second substrate, a second device layer, a plurality of second conductive patterns and a plurality of second bonding patterns bonded to the first bonding patterns.

10. The semiconductor device of claim 9, further comprises a first bonding dielectric layer aside the first bonding patterns and a second bonding dielectric layer aside the second bonding patterns, wherein the first bonding dielectric layer is in direct contact with the second bonding dielectric layer.

11. The semiconductor device of claim 9, wherein the first bonding patterns and the second bonding patterns are vias, pads or a combination thereof.

12. The semiconductor device of claim 9, wherein a pitch of the first bonding patterns and the second bonding patterns is not larger than 3 μm.

13. The semiconductor device of claim 9, wherein middle lines of the first conductive vias and the first boding patterns are respectively aligned with one another.

14. The semiconductor device of claim 9,
   wherein the second conductive patterns comprise second conductive wirings and second conductive vias alternately stacked, and middle lines of the second conductive vias and the second boding patterns are respectively aligned with one another.

15. The method of claim 9, wherein the first bonding patterns are in direct contact with the second bonding patterns, and the first bonding patterns and the second bonding patterns are vias respectively.

16. The method of claim 9, wherein one of the first conductive wirings has a first width, and one of the first bonding patterns is in direct contact with the one of the first conductive wirings and has a second width smaller than the first width.

17. A method of forming a semiconductor device, comprising:
   providing a first functional block, the first functional block comprising a first substrate, a first device layer, a first interconnect structure and a plurality of first bonding patterns, wherein the first interconnect structure comprises a plurality of first conductive vias and a plurality of first conductive wirings alternately stacked, the first bonding patterns are in direct contact with the outermost first conductive wiring, and the first bonding patterns are irregularly arranged;

providing a second functional block, the second functional block comprising a second substrate, a second device layer, a second interconnect structure and a plurality of second bonding patterns; and bonding the first functional block and the second functional block by directly bonding the first bonding patterns and the second bonding patterns.

18. The method of claim 17, wherein the second bonding patterns are irregularly arranged.

19. The method of claim 17, wherein an arrangement of the first bonding patterns is substantially the same as an arrangement of the first conductive vias in direct contact with the outermost first conductive wiring.

20. The method of claim 17, wherein bonding the first functional block and the second functional block further comprises bonding a first bonding dielectric layer aside the first bonding patterns and a second bonding dielectric layer aside the second bonding patterns.

* * * * *